(12) United States Patent
Chen

(10) Patent No.: US 12,144,141 B2
(45) Date of Patent: Nov. 12, 2024

(54) WIDTH-ADJUSTABLE BRACKET MOUNTING HOOK SET

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

(*) Notice: Subject to any disclaimer, the term of this patent is extended or adjusted under 35 U.S.C. 154(b) by 76 days.

(21) Appl. No.: 18/125,741

(22) Filed: Mar. 24, 2023

(65) Prior Publication Data
US 2024/0324134 A1    Sep. 26, 2024

(51) Int. Cl.
*H05K 7/14*    (2006.01)
*A47B 88/407*    (2017.01)

(52) U.S. Cl.
CPC ......... *H05K 7/1489* (2013.01); *A47B 88/407* (2017.01)

(58) Field of Classification Search
CPC ....... A47B 88/04; A47B 88/40; A47B 88/407; H05K 7/1489
USPC ......................................... 211/26; 248/298.1
See application file for complete search history.

(56) References Cited

U.S. PATENT DOCUMENTS

| | | | | |
|---|---|---|---|---|
| 8,807,351 B2* | 8/2014 | Lin | ........................ | A47B 88/43 |
| | | | | 312/334.4 |
| 10,251,482 B2* | 4/2019 | Chen | ....................... | A47B 96/07 |
| 10,645,826 B1* | 5/2020 | Chen | ..................... | H05K 5/0208 |
| 2019/0104846 A1* | 4/2019 | Chen | ....................... | A47B 88/43 |
| 2020/0137920 A1* | 4/2020 | Chen | ...................... | H05K 7/183 |

* cited by examiner

*Primary Examiner* — James O Hansen
(74) *Attorney, Agent, or Firm* — Fei-hung Yang

(57) ABSTRACT

A width-adjustable bracket mounting hook set includes a fixing seat, a pair of fixing columns, a lock part and an elastic hook. The fixing seat has a fixing surface and a mounting surface, the fixing surface is disposed on a bracket, the mounting surface has a hook hole and a pair of horizontal adjusting holes, and the pair of fixing columns are passed into the horizontal adjusting hole and locked onto the lock part. The two fixing columns and the lock part are engage to clamp the mounting surface for fixation, the two fixing columns are adjusted to the positions on the mounting surface, and the elastic hook is movably installed onto the fixing seat and has a hook part disposed at an end of the elastic hook, passing through the hook hole, and obliquely extending a section of the elastic part to abut against the fixing seat.

8 Claims, 7 Drawing Sheets

WIDTH-ADJUSTABLE BRACKET MOUNTING HOOK SET

BACKGROUND

Technical Field

The present disclosure relates to the field of a cabinet slide rail, and more particularly relates to a width-adjustable bracket mounting hook set provided to be installed to two ends of a bracket of the slide rail, locked to a rack, and used for adjusting the width of a 438 mm~444 mm chassis.

Description of Related Art

In general, a plurality of chassis used by industrial computers is horizontally installed inside a cabinet one by one like a drawer, each of the four corners of the cabinet is vertically provided with a rack, the surface of the rack is provided with a plurality of fixing holes or screw holes at intervals, and the industrial computers are traditionally installed in the cabinet through fixing blocks or fixing screws. In recent years, a slide rail structure with the stretching and folding characteristics is mostly used to push the industrial computers into the cabinet or selectively pull the industrial computers out from the cabinet for expansion, replacement, inspection or repair, which greatly improves the convenience of subsequent maintenance.

However, the slide rails may not be installed in the cabinet due to various different designs, so that it is necessary to install a bracket in the cabinet in order to connect and fix the slide rail. In order to facilitate the installation and removal of the bracket, a plurality of positioning columns configured to be corresponsive to the fixing holes of the rack is provided to achieve the function of a quick installation/removal function without requiring tools. Since the shape and positioning method of various positioning holes of the cabinet manufactured by different manufactures vary, the brackets must match with the shape and type of the positioning holes, and there will be many different specifications. As a result, the complexity of manufacturing and the inventory are increased significantly. At present, most structural designs of the brackets available on the market are aimed at how to improve the universal use of the brackets. For example, if the mounting holes have a round shape or a rectangular shape, the mounting columns will be designed with an automatically change shape. In addition, the bracket may also be signed with a multi-stage telescopic effect to adapt various cabinets of different depths, and all are designed to meet the needs of the present slide rails to be used with the industrial computers. However, there is a situation that the width cannot be adjusted. In the past, the System Width (which is the chassis width) such as 438.0 mm or 444.0 mm was a fixed value. When a slide rail is used, it must match with the chassis width to fit the installation. If the chassis has a width of 438.0~444.0 mm, then it will need an adapter to mount the chassis onto the slide rail by screws. Obviously, the tool-free installation function can no longer be maintained. In summation, the structural design of these brackets fails to universally meet all the specification of different slide rail products.

In summation of the description above, the structural design of these brackets cannot meet all specifications of different slide rail products. Therefore, how to develop a universal slide rail bracket product for the market demands immediate attention and feasible solutions.

A pair of fixing columns and a lock part are engaged and locked with each other to achieve the purpose of a quick width adjustment. In addition, the fixing seat has an elastic hook provided for fixing the bracket without tools, and thus greatly improving the convenience of use, avoiding the application from being affected during the width adjustment process, and overcoming the problems of the traditional slide rail bracket.

In view of the aforementioned problems, the inventor of this disclosure based on years of experience in the related industry and conduct extensive experiments to develop a width-adjustable bracket mounting hook set, which is mainly designed for adjusting a chassis with a width of 438 mm~444 mm. This disclosure includes a pair of horizontal adjusting holes formed on a mounting surface of the fixing seat and locks a pair of fixing columns and a lock part with each other to achieve the purpose of quickly adjusting the width. In addition, the fixing seat has an elastic hook that can be used for the operation of fixing the bracket without any tools, and thus greatly improving the convenience of use, avoiding the application from being affected during the width adjustment process, and overcoming the problems of the traditional slide rail bracket.

SUMMARY

In view of the aforementioned drawbacks of the related art, it is a primary objective of the present disclosure is to provide a width-adjustable bracket mounting hook set that includes a fixing seat, a pair of fixing columns, a lock part and an elastic hook. The two fixing columns and the lock part are engaged to clamp the mounting surface for fixation and used for adjusting the positions of the two fixing columns on the mounting surface. In addition, the elastic hook is movably installed onto the fixing seat, and has a hook part disposed at an end of the elastic hook, passing through the hook hole, and extending a section of the elastic part to abut against the fixing seat. With the position adjustment of the pair of fixing columns, the position of the elastic hook will be adjusted accordingly without losing its tool-free installation function. With the above structural design of this disclosure, the width-adjustable bracket mounting hook set can be locked onto a rack and adjusted corresponding to the chassis with a width of 438 mm~444 mm, so as to greatly reduce the manufacturing cost and inventory and achieve other effects.

To achieve the aforementioned and other objectives, this disclosure discloses a width-adjustable bracket mounting hook set, provided to be installed to two ends of a pair of brackets separately, each bracket is built with a slide rail, the two slide rails are disposed on two sides of a chassis respectively and installed in a cabinet through the bracket mounting hook sets. Each bracket mounting hook set includes: a fixing seat, with a fixing surface and a mounting surface and having a plurality of fixing holes and a pivot hole provided to be mounted on one of the end surfaces of the bracket, and the mounting surface having a hook hole and a pair of horizontal adjusting holes; a pair of fixing columns, passing into the horizontal adjusting hole, and an end of each fixing column having a threaded part; a lock part, having two screw holes corresponding to the two fixing columns, and the two fixing columns being passed through the two horizontal adjusting holes and locked to the lock part, and then fixed by engaging the two fixing columns and the lock part to clamp the mounting surface, so as to fix the two fixing columns onto the mounting surface; and an elastic hook, having a pivot part disposed at an end thereof and movably installed into the pivot hole, and the other end of the elastic hook having a hook part passing through the hook hole, and obliquely extending a section of an elastic part from a material on a side of the pivot part, and the elastic part abutting against the fixing seat to produce a resilient force in order to keep the elastic hook in a locked position.

In an embodiment of this disclosure, the fixing seat has a first folded edge bent and configured to be corresponsive to two side edges of the fixing surface separately, and a second folded edge configured to be corresponsive to a position above the mounting surface. The first folded edge and the second folded edge can improve the structural strength of the fixing seat, provide a positioning effect during installation, and make an end of the elastic part to abut against the first folded edge or the second folded edge to define a movement limitation. After the elastic part is compressed, the resilience required by the elastic hook is provided. It is noteworthy that the elastic part has a thinned section disposed at a position adjacent to the elastic hook of the elastic part, and an end of the elastic part is bent to form a reinforcing part. Since the thickness of the thinned section becomes smaller and has a good resilient force and the reinforcing part is designed with a curved shape due to the friction that may be produced from the movement limitation, therefore the friction can be reduced, and the structural strength can be improved. In addition, the thinned section has a thickness falling within a range of 65%~75% of the thickness of the elastic hook, and actual tests show that such thickness can provide the most appropriate resilient force. In this embodiment, the width-adjustable bracket mounting hook set further includes a bending part which is formed by stamping and disposed at a mid-section position of the elastic hook for reinforcing the overall strength and keeping the hook part at the middle of the hook hole.

In another embodiment of this disclosure, the pair of horizontal adjusting holes are provided for installing the chassis with a width falling within a range of 438 mm~444 mm, and thus the width of each horizontal adjusting hole is greater than or equal to 6 mm, and the two horizontal adjusting holes are configured to be parallel to each other and spaced from each other. In addition, an end of each fixing column opposite to the threaded part is provided with a hand tool operating part to facilitate locking each fixing column onto the lock part by a hand tool, so as to further improve the stability after installation.

DESCRIPTION OF THE EMBODIMENTS

This disclosure will now be described in more detail with reference to the accompanying drawings that show various embodiments of this disclosure.

Figure 1A:
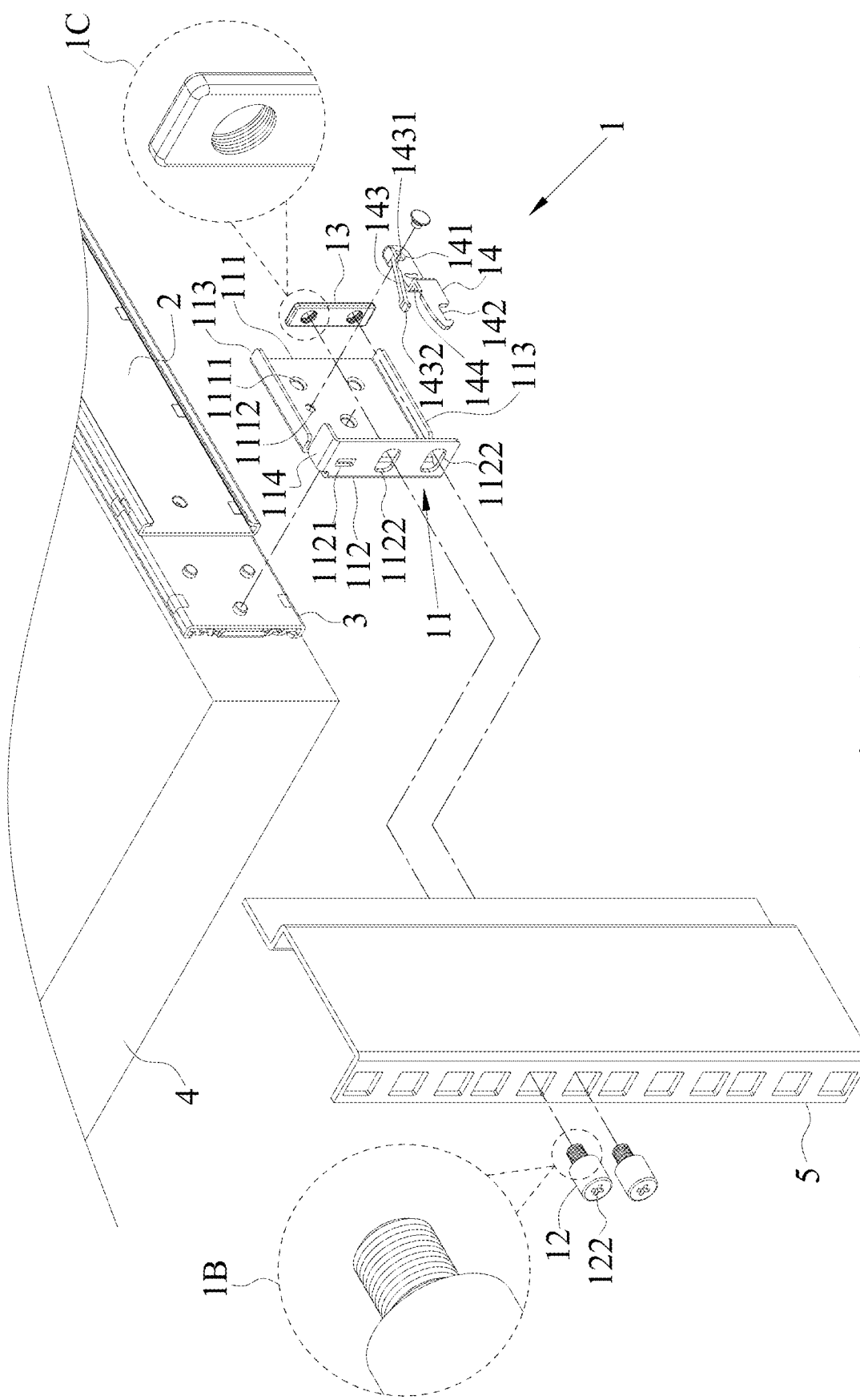
FIG. 1A is a schematic view of the structure of a preferred embodiment of this disclosure.
Figure 1B:
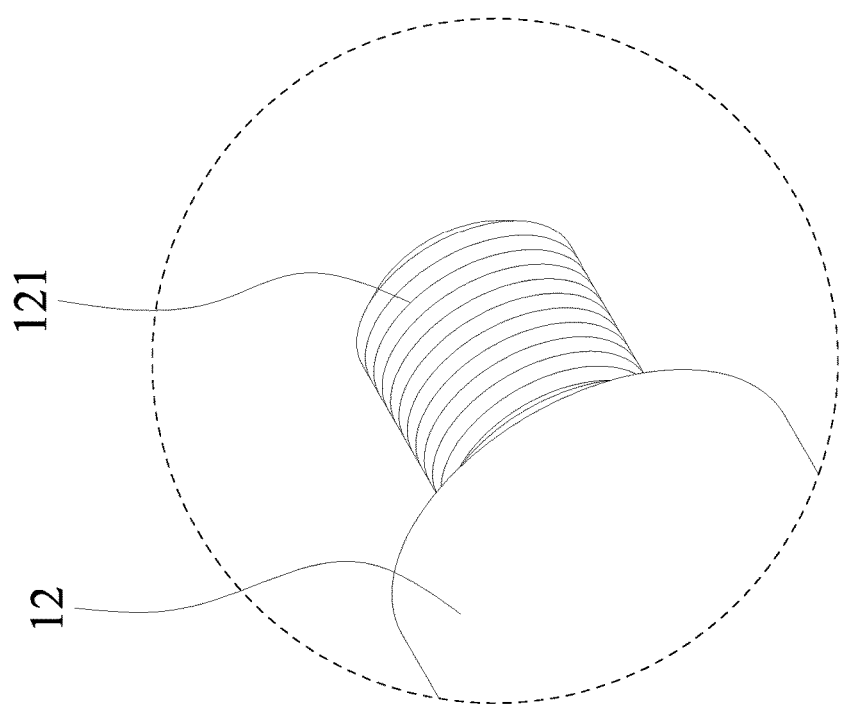
FIG. 1B is a first partial blow-up view of a preferred embodiment of this disclosure.
Figure 1C:
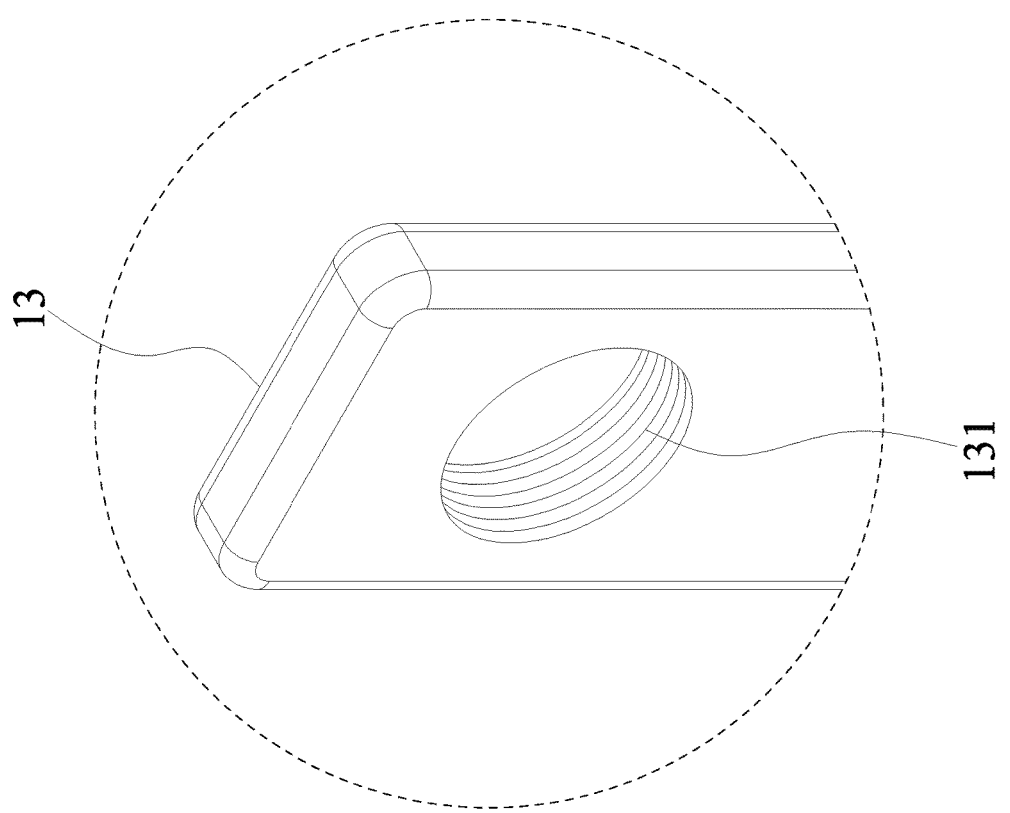
FIG. 1C is a second partial blow-up view of a preferred embodiment of this disclosure.
Figure 2:
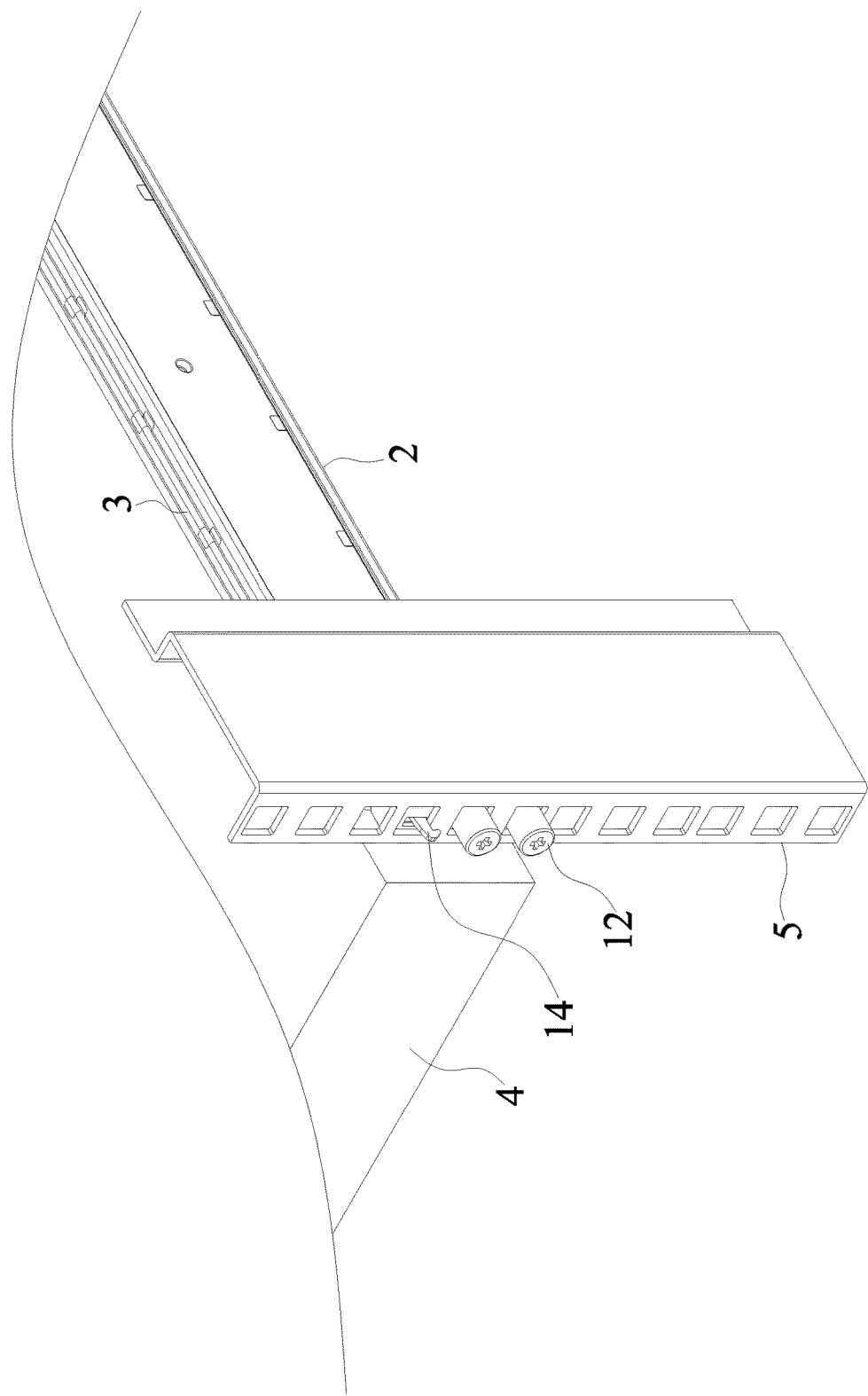
FIG. 2 is a schematic view showing the status of a preferred embodiment of this disclosure during installation.
Figure 3:
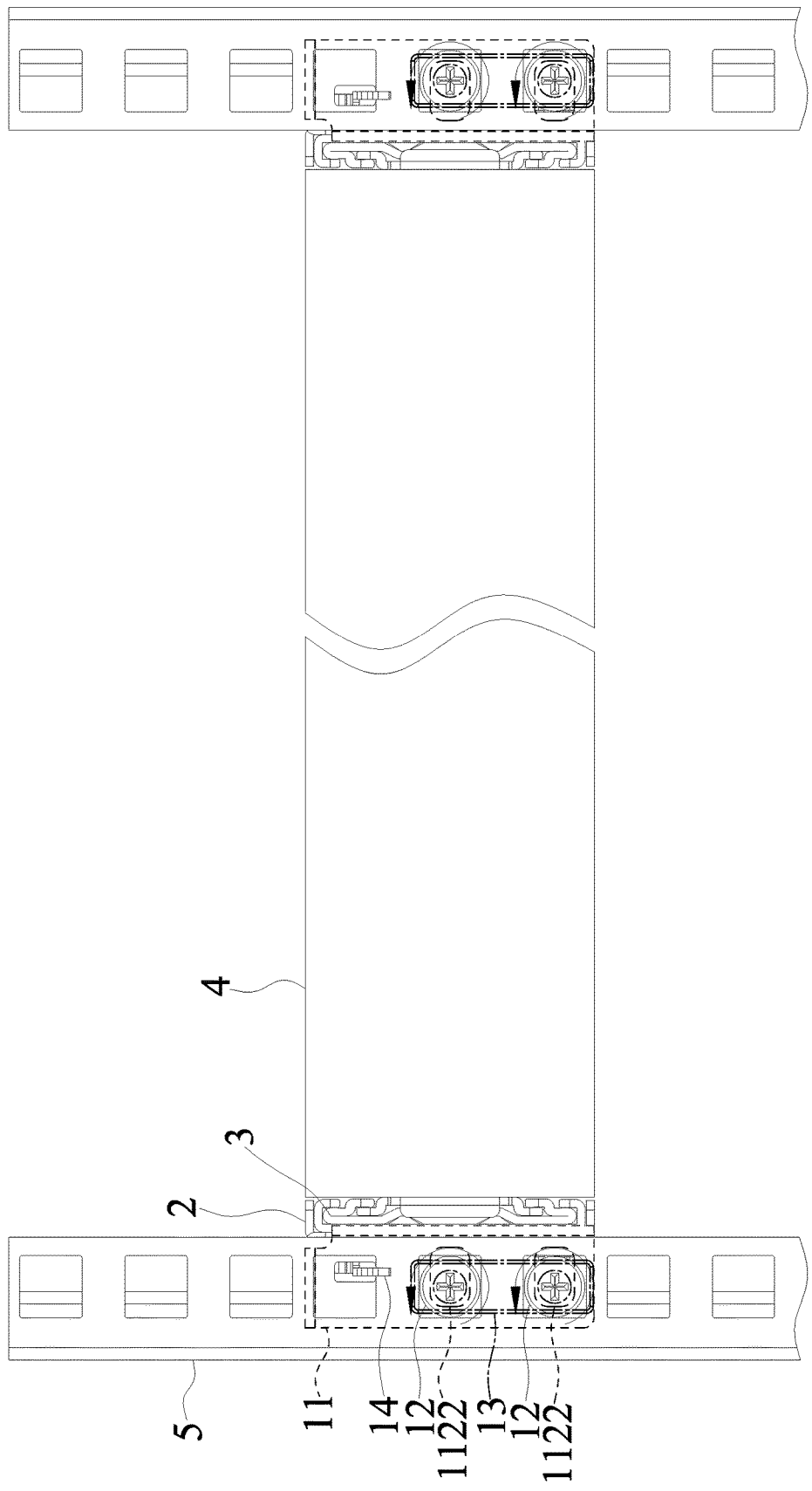
FIG. 3 is a first schematic view showing the status of a preferred embodiment of this disclosure during operation.
Figure 4:
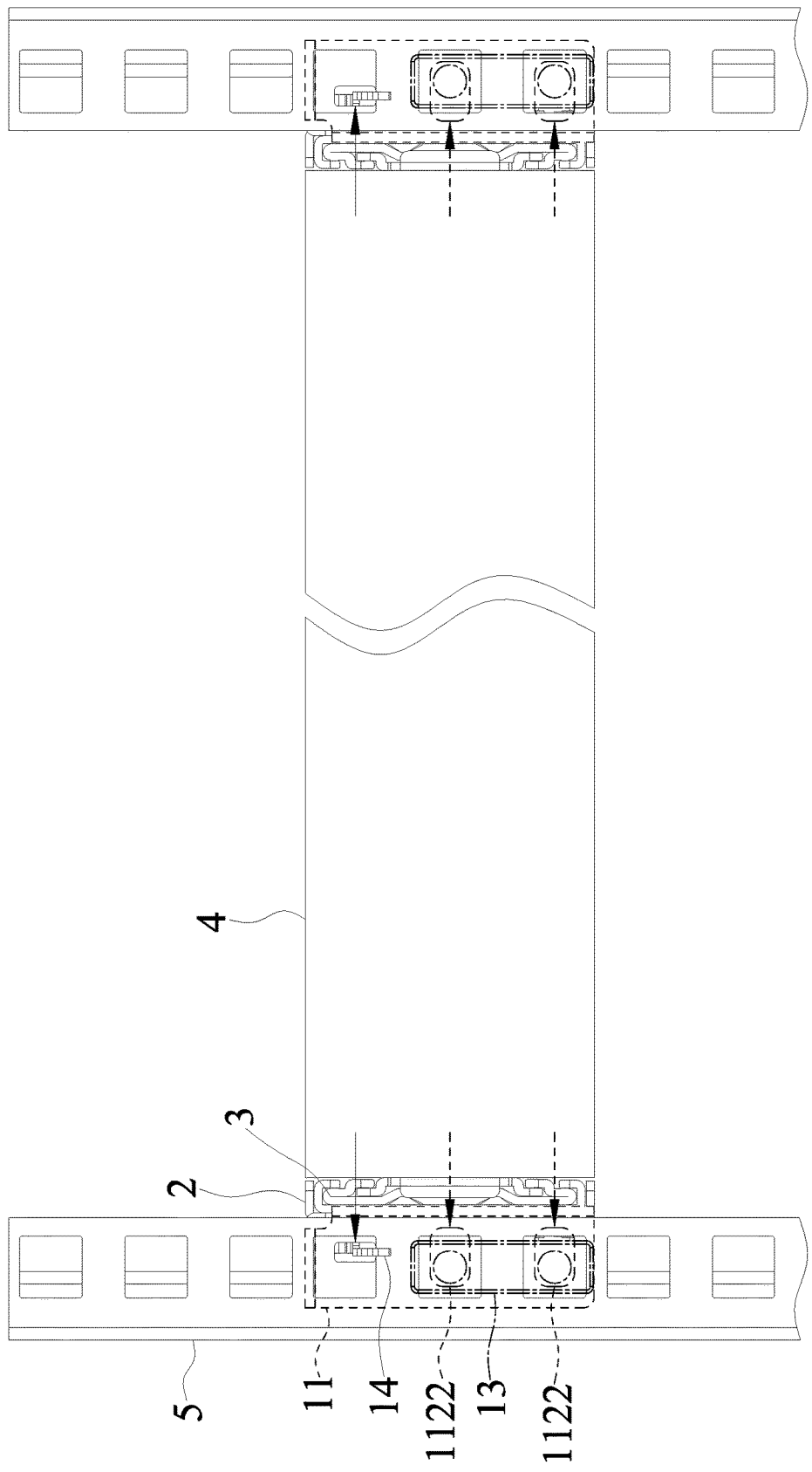
FIG. 4 is a second schematic view showing the status of a preferred embodiment of this disclosure during operation.
Figure 5:
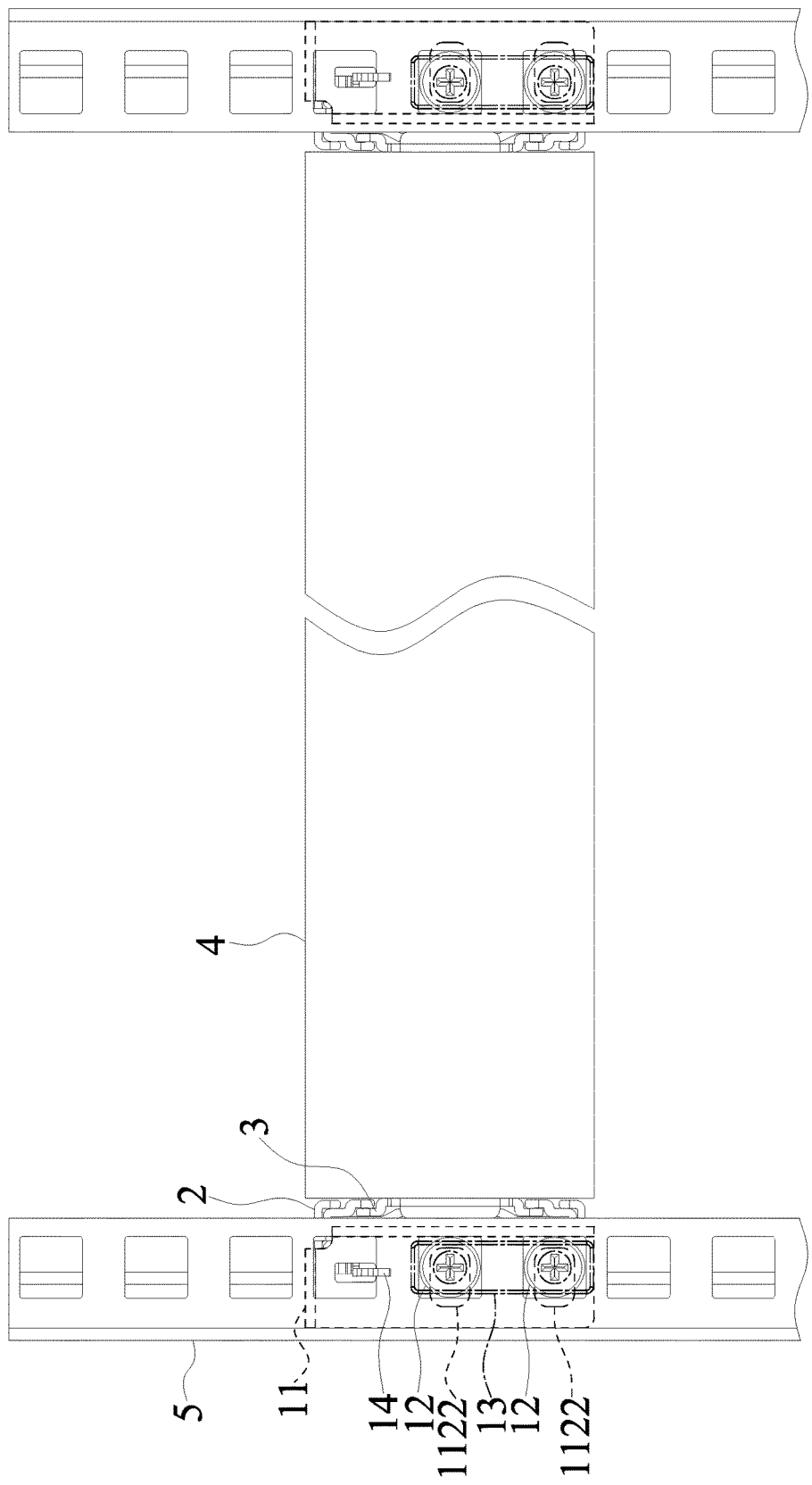
FIG. 5 is a third schematic view showing the status of a preferred embodiment of this disclosure during operation.

With reference to FIGS. 1A, 1B, 1C, 2 and 3~5 for the schematic view of the structure, the hardware block diagram and various operating statuses of a width-adjustable bracket mounting hook set 1 in accordance with a preferred embodiment of this disclosure respectively, the width-adjustable bracket mounting hook set 1 includes a fixing seat 11, a pair of fixing columns 12, a lock part 13 and an elastic hook 14. The width-adjustable bracket mounting hook set 1 is provided to be installed to two ends of a pair of brackets 2 separately, a slide rail 3 is fixed into each bracket 2, the two slide rails 3 are disposed on two sides of a chassis 4 respectively, and the two brackets 3 are installed in a cabinet 5 through the bracket mounting hook sets 1.

The fixing seat 11 is formed by cutting, stamping and bending a metal sheet, and the fixing seat 11 has a fixing surface 111 and a mounting surface 112 to form an L-shaped structure (viewing from a side). The fixing surface 111 has a plurality of fixing holes 1111 and a pivot hole 1112 provided to be mounted onto one of the end surfaces of the bracket 2, and the mounting surface 112 has a hook hole 1121 and a pair of horizontal adjusting holes 1122. It is noteworthy that the pair of horizontal adjusting holes 1122 are provided for installing the chassis 4 with a width falling within a range of 438 mm~444 mm, and thus the width of the pair of horizontal adjusting holes 1122 is greater than or equal to 6 mm, and the horizontal adjusting holes 1122 are spaced from each other and arranged parallel to each other. In addition, the fixing seat 11 has a first folded edge 113 bent from two side edges of the fixing surface 111 separately, and a second folded edge 114 configured to be corresponsive to a position above the mounting surface 112, and the pair of the first folded edge 113 and the second folded edge 114 are bent towards the same side as shown in the figure and configured to be facing outward after the installation.

The pair of fixing columns 12 are passed into the two horizontal adjusting holes 1122 respectively, and an end of each fixing column 12 is provided with a threaded part 121. In addition, each fixing column 12 has a hand tool operating part 122 disposed at the other end relative to the threaded part 121 to facilitate locking each fixing column 12 to the lock part 13 by a hand tool.

The lock part 13 is a sheet structure made of metal, and the two fixing columns 12 of the corresponding lock part have two screw holes 131, so that the two fixing columns 12 can be passed through the two horizontal adjusting holes 1122 and locked to the lock part 13, and then the two fixing columns 12 and the lock part 13 are engaged to clamp the mounting surface 112 for fixation, so as to fix the two fixing columns 12 at positions of the mounting surface 112 to fit the width of the chassis 4.

The elastic hook 14 is formed by cutting, stamping and bending a metal material, and an end of the elastic hook 14 is provided with a pivot part 141 which is movably installed to the pivot hole 1112, so that the elastic hook 14 can swing on the fixing surface 111, and the other end of the elastic hook 14 is provided with a hook part 142 which is passed through the hook hole 1121, and the material on a side of the pivot part 141 obliquely extends a section of the elastic part 143, such that the elastic part 143 abuts against the fixing seat 11 to produce a resilient force in order to keep the elastic hook 14 at a locked position. It is noteworthy that during the manufacturing process, the elastic part 143 has a thinned section 1431 disposed adjacent to the position of the elastic hook 14, and an end of the elastic part 143 is bent to form a reinforcing part 1432, so that the reinforcing part 1432 at the end of the elastic part 143 abuts against the first folded edge 113 or the second folded edge 114. In order to obtain the best resilient force, actual testing shows that the thinned section 1431 of this disclosure preferably has a thickness falling within a range of 65%~75% of the thickness of the elastic hook 14. In addition, the elastic hook 14 further has a bending part 144 which is formed by stamping and disposed at the mid-section position of the elastic hook 14 for reinforcing the overall strength and maintaining the hook part 142 at the middle of the hook hole 1121.

In summation of the description above, the width-adjustable bracket mounting hook set 1 of this disclosure is engaged and clamped on the mounting surface 112 for fixation by the two fixing columns 12 and the lock part 13, so that the position of the two fixing columns 12 on the mounting surface 112 can be adjusted, and the chassis with a width of 438 mm~444 mm can be adjusted quickly and intuitively, which greatly improves the convenience of use. In addition, the elastic hook 14 movably disposed on the fixing seat 11 is used, and an end of the hook part 142 is passed through the hook hole 1121 and fixed onto the cabinet 5 to complete fixing and installing the bracket 2, and thus the operation is simple, easy and convenient, and this design can also greatly reduce the manufacturing cost and inventory.

What is claimed is:

1. A width-adjustable bracket mounting hook set, provided to be installed to two ends of a pair of brackets separately, each bracket being built with a slide rail, the two slide rails being disposed on two sides of a chassis respectively, and the pair of brackets are installed in a cabinet through the bracket mounting hook set, respectively, and each bracket mounting hook set comprising:

a fixing seat, with a fixing surface and a mounting surface, the fixing surface having a plurality of fixing holes and a pivot hole provided to be mounted on one of the end of the bracket, and the mounting surface having a hook hole and a pair of horizontal adjusting holes;

a pair of fixing columns, passing into the horizontal adjusting holes, and an end of each fixing column having a threaded part;

a lock part, having two screw holes corresponding to the two fixing columns, and the two fixing columns being passed through the two horizontal adjusting holes and locked to the lock part, and then fixed by engaging the two fixing columns and the lock part to clamp the mounting surface, so as to fix the two fixing columns onto the mounting surface; and an elastic hook, having a pivot part disposed at an end thereof and movably installed into the pivot hole, and another end of the elastic hook having a hook part passing through the hook hole, and obliquely extending a section of an elastic part from a material on a side of the pivot part, and the elastic part abutting against the fixing seat to produce a resilient force in order to keep the elastic hook in a locked position, wherein the elastic hook is integrally formed, and the hook hole is located above the pair of horizontal adjusting holes in a direction parallel to a height direction of the mounting surface.

2. The width-adjustable bracket mounting hook set according to claim 1, wherein the fixing seat has a first folded edge bent and configured to be corresponsive to two side edges of the fixing surface separately, and a second folded edge is extended from a top side of the mounting surface.

3. The width-adjustable bracket mounting hook set according to claim 2, wherein the elastic part has an end abutting against the first folded edge or the second folded edge.

4. The width-adjustable bracket mounting hook set according to claim 1, wherein the elastic part has a thinned section disposed at a position of the elastic part adjacent to the elastic hook, and an end of the elastic part is bent to form a reinforcing part.

5. The width-adjustable bracket mounting hook set according to claim 4, wherein the thinned section has a thickness falling within a range of 65%~75% of the thickness of the elastic hook.

6. The width-adjustable bracket mounting hook set according to claim 5, further comprising a bending part which is disposed at a mid-section position of the elastic hook after the bending part is stamped and formed, and provided for reinforcing overall strength and making the hook part to be disposed at middle of the hook hole.

7. The width-adjustable bracket mounting hook set according to claim 1, wherein the pair of horizontal adjusting holes are provided for installing the chassis with a width falling within a range of 438 mm~444 mm, and the pair of horizontal adjusting holes have a width greater than or equal to 6 mm.

8. The width-adjustable bracket mounting hook set according to claim 1, wherein each fixing column has a hand tool operating part configured to be located at an end opposite to the threaded part, for facilitating use of a hand tool to lock each fixing column onto the lock part.

* * * * *